US006762973B2

(12) United States Patent
Shu et al.

(10) Patent No.: US 6,762,973 B2
(45) Date of Patent: Jul. 13, 2004

(54) DATA COHERENT LOGIC FOR AN SRAM DEVICE

(75) Inventors: Lee-Lean Shu, Los Altos, CA (US); Chenming W. Tung, Fremont, CA (US); Stephen Lee, Santa Clara, CA (US)

(73) Assignee: Giga Semiconductor, Inc., Santa Clara, CA (US)

( * ) Notice: Subject to any disclaimer, the term of this patent is extended or adjusted under 35 U.S.C. 154(b) by 6 days.

(21) Appl. No.: 10/322,215

(22) Filed: Dec. 17, 2002

(65) Prior Publication Data

US 2004/0114440 A1 Jun. 17, 2004

(51) Int. Cl.[7] .............................................. G11C 13/00
(52) U.S. Cl. ...................................... 365/233; 365/239
(58) Field of Search ............................ 365/233, 189.12, 365/239

(56) References Cited

U.S. PATENT DOCUMENTS

| | | | |
|---|---|---|---|
| 5,828,606 A | | 10/1998 | Mick |
| 5,841,732 A | | 11/1998 | Mick |
| 6,094,399 A | | 7/2000 | Mick |
| 6,094,703 A | * | 7/2000 | Pawlowski ................... 711/104 |
| 6,205,514 B1 | * | 3/2001 | Pawlowski ................... 711/104 |
| 6,253,298 B1 | * | 6/2001 | Pawlowski ................... 711/169 |

* cited by examiner

Primary Examiner—Vu A. Le
(74) Attorney, Agent, or Firm—Gray Cary Ware & Freidenrich LLP

(57) ABSTRACT

The present invention provides data coherent logic for an SRAM device. The present invention utilizes a data strobe signal and an output strobe signal to control data written into and read out of the SRAM device from an input/output pad. Data coherent logic is designed to resolve timing conflicts between the data and output strobe signals. The logic selectively delays the output strobe signal when a match occurs for data requested in a read operation immediately following a write operation. The delay allows sufficient time for the data to be registered and selected before being outputted from the device.

19 Claims, 4 Drawing Sheets

DATA COHERENT LOGIC FOR AN SRAM DEVICE

FIELD OF THE INVENTION

The present invention generally relates to semiconductor memory devices, such as static random access memory ("SRAM") devices. More particularly, the present invention relates to an SRAM device having data coherent logic for resolving timing conflicts related to reading and writing operations.

BACKGROUND OF THE INVENTION

An SRAM is a semiconductor memory device that allows data to be stored in a static manner, i.e., in a manner that does not require any refresh cycles to maintain stored data. Many SRAM devices utilize a "pipeline" system to temporarily store address and data signals prior to writing data into the SRAM array. In these types of systems, data is provided on a data bus during one clock cycle and an address is provided on the address bus during a subsequent clock cycle. Read and write operations typically use the same input/output pad, and the input and output buffers operate in a mutually exclusive manner (e.g., for the output buffer to transfer read data out of the device, the input buffer for receiving write data must be inactive, and vice versa).

In these types of memory devices, write operations take longer than read operations. This may cause problems when a write operation is immediately followed by a matching read operation (i.e., a read operation requesting data from the same address as the write operation). In conventional SRAM devices, time or clock cycles may be lost because the read operation must wait for the write operation to complete prior to reading the data from the memory location. These lost clock cycles may significantly reduce the efficiency and bandwidth of the system.

Efforts have been made to reduce and/or eliminate these problems. One such solution involves the use of buffers or shift registers within an SRAM device to hold data prior to writing the data into the SRAM array. In these types of devices, when a match occurs for the data (i.e., when the address of the data requested for a read operation is the same as the address of data that being written to the SRAM array), the matched data may be transferred from the corresponding shift register into the output register of the device by use of an output strobe signal.

However, even in these types of systems, memory conflicts occur. Because the same pad is used to input data into the SRAM device (e.g., for a write operation) and output data from the SRAM device (e.g., in response to a read operation), timing conflicts between memory operations may occur. Use of the input/output pad is controlled by the output strobe signal and a data strobe signal (which is used to validate data written to the SRAM device). The data strobe signal and the output strobe signal each has its own specific timing requirements. The output strobe signal is usually the fastest and most critical signal in an SRAM design. In contrast, the data strobe signal requirements are more relaxed and depend on other requirements, such as data setup and hold times. As a result, in certain situations, the difference in timing between the data strobe signal and the output strobe signal may result in a conflict of interest.

The present invention provides a data coherent SRAM system, which overcomes the foregoing drawbacks of prior memory systems and resolves timing conflicts related to reading and writing operations.

SUMMARY OF THE INVENTION

The present invention provides data coherent logic for an SRAM device. One embodiment the present invention utilizes a data strobe signal and an output strobe signal to control data written into and read out of the SRAM device from an input/output pad. The present invention employs logic that is designed to resolve timing conflicts between the data and output strobe signals to provide data coherence. In one embodiment, the output strobe signal is selectively delayed when a match occurs for data requested in a read cycle immediately following a write cycle, thereby allowing time for the data to be registered before being outputted from the device. The signals are optimized to reduce the time period when neither the input nor output buffer is driving the memory device.

According to a first aspect of the present invention, an SRAM system with data coherence is provided. The SRAM system includes: an SRAM array; a plurality of registers for holding data and addresses for write cycles; a data strobe line that provides a data strobe signal for selectively registering data in the plurality of registers; an output strobe line that provides an output strobe signal for selectively outputting data from the SRAM array for read cycles; and an output strobe circuit that is coupled to the output strobe line and that is adapted to selectively delay the output strobe signal in response to a first match condition, which occurs when a read cycle immediately follows a write cycle and requests data from the same address as the write cycle, the delay being effective to allow sufficient time for the data to be registered and selected.

According to a second aspect of the present invention, a method is disclosed for providing data coherence in an SRAM device. The method includes the steps of: detecting read and write cycles; storing data and addresses for write cycles in a plurality of registers; selectively registering data for the write cycles in the plurality of registers by use of a data strobe signal; selectively outputting data for read cycles by use of an output strobe signal; detecting a first match condition, which occurs when a read cycle immediately follows a write cycle and requests data from the same address as the write cycle; and selectively delaying the output strobe signal in response to the first match condition, the delay being effective to allow sufficient time for the data to be registered and selected.

The method may further include the steps of storing data within at least one latch associated with at least one data shift register; detecting a second match condition, which occurs when a read cycle follows two or more consecutive write cycles and requests the same data as a first write cycle; and selectively outputting data from the at least one latch in response to a second match condition.

The method may further include the steps of detecting a third match condition, which occurs in a case other than a read after write cycle; and selectively outputting data from one of the data shift registers in response to the third match condition.

These and other features, advantages, and objects of the invention will become apparent by reference to the following specification and by reference to the following drawings.

DETAILED DESCRIPTION OF THE PREFERRED EMBODIMENT OF THE INVENTION

The present invention will now be described in detail with reference to the drawings, which are provided as illustrative examples of the invention so as to enable those skilled in the art to practice the invention. Notably, the implementation of certain elements of the present invention may be accomplished using software, hardware, firmware or any combination thereof, as would be apparent to those of ordinary skill in the art, and the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

Figure 1:
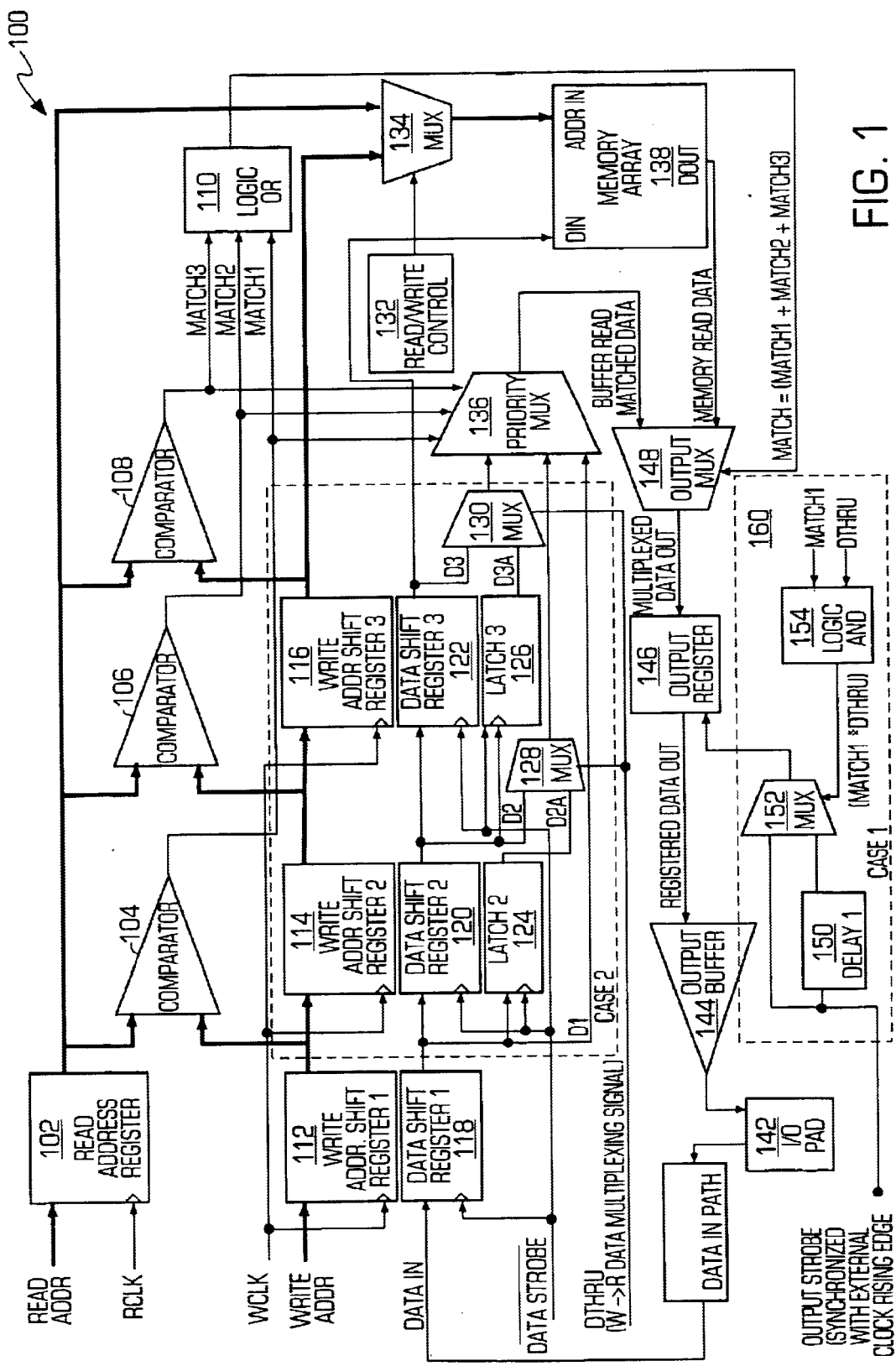
FIG. 1 is a schematic diagram of a data coherent SRAM system according to the present invention.

FIG. 1 illustrates an SRAM system 100 that is made in accordance with a preferred embodiment of the present invention and that is adapted to execute read and write operations with data coherence. It should be appreciated by one of ordinary skill in the art that system 100 may comprise a removable portion or module of a larger computer system. In the preferred embodiment, system 100 may include the following circuit components: a read address register 102, comparators 104, 106 and 108; a logic OR block 110; write address shift registers 112, 114, and 116; data shift registers 118, 120 and, 122; latches 124, 126; data multiplexers 128, 130; read/write control circuit 132; address multiplexer 134; priority multiplexer 136; SRAM array 138; input/output pad 142; output buffer 144; output register 146; output multiplexer 148; and an output strobe circuit 160 including delay 150, multiplexer 152, and logic AND block 154. The foregoing components are communicatively and cooperatively linked together to provide data coherence in the SRAM system 100, as described below.

Read address register 102 receives external read addresses (READ ADDR) and a read clock signal (RCLK), which is used to control the transmission of the read addresses from register 102. Read address register 102 is communicatively coupled to the inputs of comparators 104, 106 108, and to address multiplexer 134. Comparators 104, 106 and 108 are further respectively coupled to write address shift registers 112, 114 and 116, and receive as inputs the data stored in registers 112, 114, and 116, respectively. The outputs of comparators 104, 106 and 108 are each coupled to logic OR block 110, and respectively provide MATCH1, MATCH2 and MATCH3 signals to logic OR block 110. The outputs of comparators 104, 106 and 108 are further coupled and provide control signals to priority multiplexer 136. MATCH1, MATCH2 and MATCH3 signals are associated with data shift registers 118, 120 and 122, respectively. When two or more MATCH signals are active, MATCH1 has highest priority and MATCH3 has lowest priority. Multiplexer 134 is coupled to and receives input from register 102 and register 116. Multiplexer 134 is controlled by read/write control block 132 and provides an output signal to the address input port of SRAM array 138. Particularly, read/write control block 132 causes multiplexer 134 to provide read addresses (from read address register 102) to SRAM array 138 during read operations, and write addresses (from write address shift register 116) to SRAM array 138 during write operations.

Write address shift register 112 receives external write addresses (WRITE ADDR), and is coupled to write address shift register 114. Write address shift registers 112, 114, and 116 each receive a write clock signal (Wclk). The write clock signal controls the transfer of write addresses from register 112 to register 114 as well as write addresses from register 114 to register 116. Write address shift register 112 is associated with data shift register 118 (i.e., the data contained in register 118 is written to the address contained in register 112) Data shift register 118 receives data (DATA IN) from input/output pad 142, and is coupled to data shift register 120 and latch 124. Data shift register 118 also receives the data strobe signal ($\overline{\text{DATASTROBE}}$), which controls the transfer of write data from register 118 to register 120 and latch 124.

Write address shift register 114 is associated with data shift register 120 (i.e., the data contained in register 120 is written to the address contained in register 114). Latch 124 is also associated with register 120 (i.e., latch 124 latches data that is transferred to register 120 and allows the data to be available a half cycle early, or a halt cycle before it is available in the register 120). Write address shift register 114 is further coupled to write address shift register 116, and data shift register 120 is further coupled to data shift register 122, latch 126, and multiplexer 128. The output of latch 124 is coupled to multiplexer 128. Data shift register 120 and latch 124 are each further coupled to the data strobe line, which controls the transfer of data from the devices to registers 122, latch 126, and multiplexer 128.

Write address shift register 116 its associated with data shift register 122 (i.e., the data contained in register 122 is written to the address contained in register 116). Latch 126 is also associated with register 122 (i.e., latch 126 latches data that is transferred to register 122 and allows the data to be available a half cycle early, or a half cycle before it is available in the register 122). Write address shift register 116 is further coupled to multiplexer 134, and data shift register 122 is further coupled to multiplexer 130 and the data input port of SRAM array 138. The output of latch 126 is coupled to multiplexer 130. Data shift register 120 and latch 126 are each further coupled to the data strobe line, which controls the transfer of data from the devices to multiplexer 134, SRAM array 138 and multiplexer 130.

Multiplexers 128 and 130 are coupled to priority multiplexer 136, and are and controlled by read/write data signal (DTRHU). Priority multiplexer 136 is coupled to and provides matched data to output multiplexer 148. The data output of SRAM array 138 is also coupled to multiplexer 148 and provides memory read data to multiplexer 148. Multiplexer 148 is coupled to and receives a match control signal from logic OR block 110. The output of multiplexer 148 is coupled to output register 146. Output register 146 is coupled to output buffer 144, which is coupled to and provides output data to input/output pad 142. Output register 146 is controlled by output strobe circuit 160. Particularly, multiplexer 152 of output strobe circuit 160 signals output register 146 to transfer data to the output buffer 144.

Multiplexer 152 receives an output strobe signal from the output strobe line, and a delayed output strobe signal from delay 150. Multiplexer 152 is further coupled to and receives control from logic AND block 154. Logic AND block 154 receives MATCH1 and DTHRU signals as inputs.

In operation, system 100 ensures data coherence for read and write operations in SRAM array 138. Particularly, system 100 is adapted to resolve timing problems between the data and output strobe signals, and to allow read operations to occur with minimal lost clock cycles regardless of the status of a write operation for the same data. System 100 may encounter three different matching conditions or scenarios: (i) in a read after write cycle, when the read cycle requests the same data as the immediately preceding write cycle (e.g., when a match condition exists for data contained in the first write address shift register 112); (ii) in a read after write cycle, when the read cycle occurs after two or three write cycles and the read cycle requests the same data as the first write cycle (e.g., when a match condition exists for data contained in the second or third address shift registers 114, 116); and (iii) when a match condition exists in a case other than case (i) or (ii) (e.g., in a case other than a read after write cycle).

Figure 2:
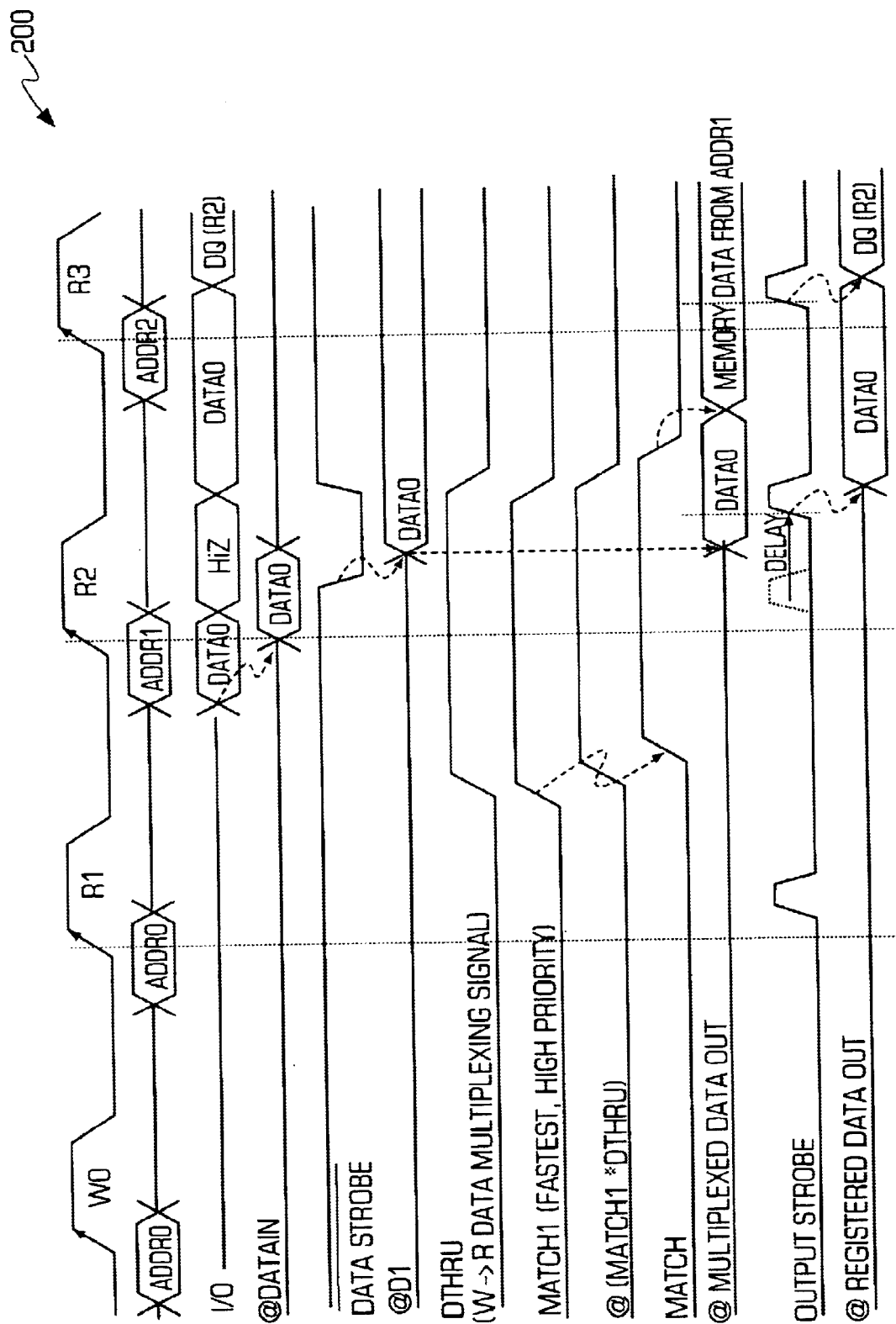
FIG. 2 is an exemplary timing diagram for the present invention illustrating a first match condition, which occurs when a read cycle requests the same data as a write cycle that immediately precedes the read cycle.

In the first scenario, the present invention selectively delays the OUTPUT STROBE signal in order to allow enough time for the external data to be registered by the data strobe signal ($\overline{\text{DATASTROBE}}$) and for selection of the matched data. The output strobe delay is provided by output strobe delay circuit 160, which receives as inputs signals OUTPUT STROBE, MATCH1 and DTRHU. FIG. 2 is a timing diagram 200, illustrating the relevant waveforms during this first scenario. As shown in diagram 200, this first scenario involves a read cycle (R1), which occurs immediately after a write cycle (W0) and requests data (DATA0) contained at the same address (ADDR0) as the immediately preceding write cycle. When an address for a read cycle matches an address for a write cycle contained in the first register 112, comparator 104 sets the MATCH1 signal to a high value (e.g., a logic "1" value). Concomitantly, the DTHRU signal is set high by the transition from a write cycle to a read cycle. Logic AND block 154 receives the high MATCH1 and DTRHU signals and generates a high output signal MATCH1*DTRHU to control multiplexer 152, and generates the delayed OUTPUT STROBE signal, which is delayed by the length of time provided by delay block 150.

The logic OR block 110 also receives the high MATCH1 value, and generates a high MATCH signal to control output multiplexer 148. Input/output pad 142 receives the data from address ADDR0 (i.e., DATA0), and communicates it to the data shift register 118 as DATAIN. The DATA STROBE signal is then activated causing the registered data (DATA0) to be transferred from shift register 118 as data D1. The data D1 is selected by priority multiplexer 136 by use of the MATCH1 signal, and is outputted to output multiplexer 148. The high MATCH signal selects the data D1 and outputs the data as MULTIPLEXED DATA OUT. As shown in the timing diagram, the delay in the OUTPUT STROBE signal allows sufficient time for the matched data (DATA0) to be selected and registered in output register 146. The length of the output delay (DELAY1) depends on the design and components of the circuit, and the manner of calculating of the requisite delay would be apparent to one skilled in the art. The registered data (DATA0) is then communicated to the output buffer 144 as REGISTERED DATA OUT, where it is subsequently transferred out of the memory device from input/output pad 142. During the time period between the transfer of DATA0 into the device, and the transfer of DATA0 out of the device, a HiZ signal may appear on the input/output pad 142. During the HiZ period, neither the input nor the output buffer is driving the device. As will be appreciated by those skilled in the art, the duration of the HiZ period will depend on the hold time of the external data and the delay of the output strobe signal, and that the HiZ period may be very short in duration and/or non-existent depending on the selected design parameters.

As shown in FIG. 2, the address (ADDR1) of the second read request (R2) is communicated to the memory array 148 and is outputted to multiplexer 148 as MEMORY READ DATA. When the MATCH signal goes low, the output multiplexer 148 will select the MEMORY READ DATA, which is then outputted from the device by the next OUTPUT STROBE pulse. As shown by the I/O waveform, there is substantially no delay between the data output from the first and second read cycles.

Figure 3:
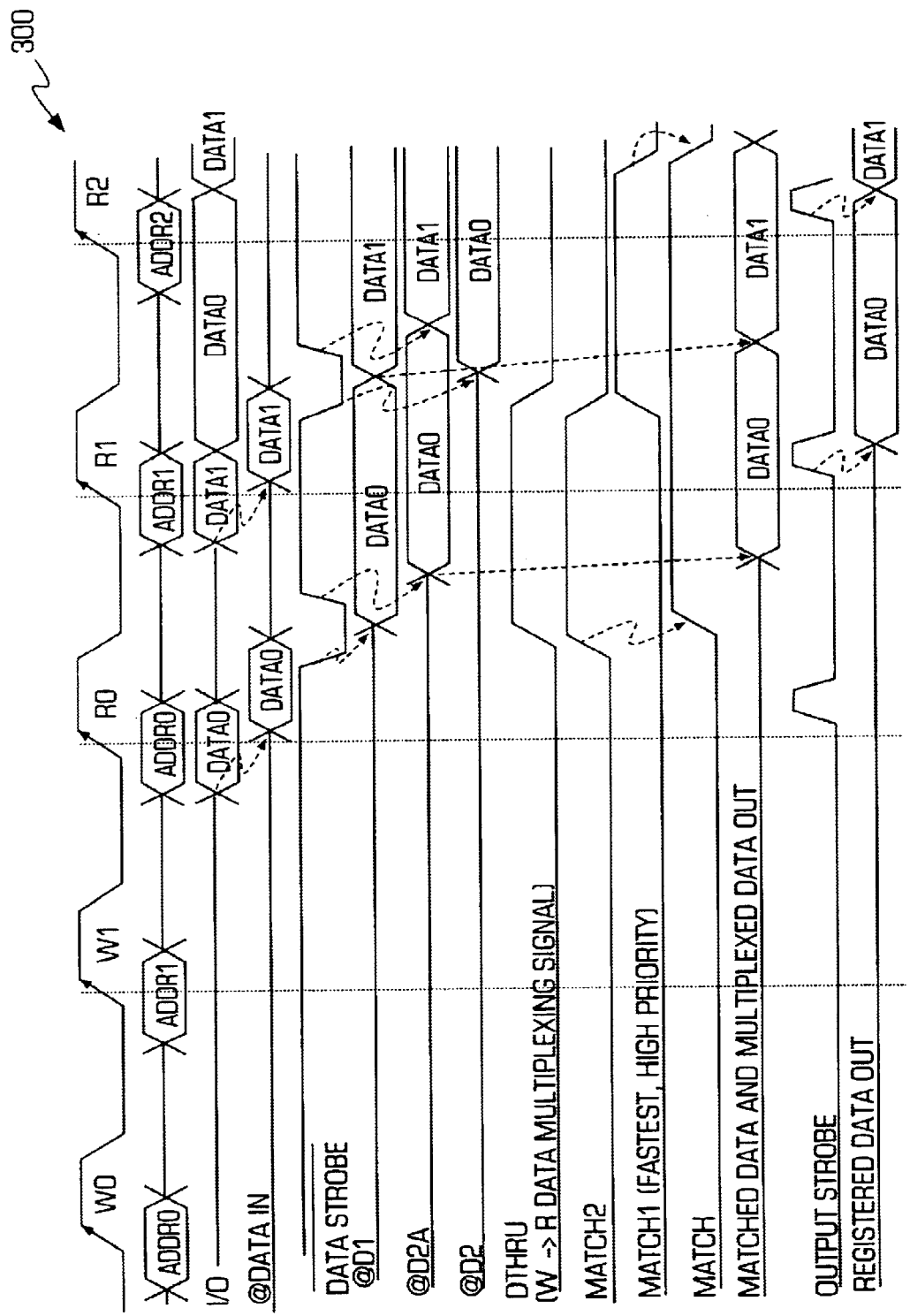
FIG. 3 is an exemplary timing diagram for the present invention illustrating a second match condition, which occurs when a read cycle follows two or three consecutive write cycles, and requests the same data as a first write cycle.

In the second scenario, the present invention does not delay the OUTPUT STROBE signal, since the data being outputted is from an earlier write cycle (i.e., a write cycle not immediately preceding the read cycle). FIG. 3 is a timing diagram 300, illustrating the relevant waveforms of during this second scenario. In this second scenario, a read operation (R0) occurs after consecutive write operations (e.g., W0 and W1), and requests data (DATA0) contained at the address (ADDR0) of the first write operation (W0). When an address for a read cycle matches an address for a write cycle contained in the second register 114, comparator 106 sets the MATCH2 signal to a high value (e.g., a logic "1" value).

The DTHRU signal causes the pre-latched data (D2A or DATA0) from latch 124 to be communicated to priority multiplexer 136. The MATCH2 signal selects the data (D2A) and communicates the selected data to the output multiplexer 148. The high MATCH signal selects the matched data D2A and outputs the data as MULTIPLEXED DATA OUT. As shown in the timing diagram, no delay is required in the OUTPUT STROBE signal, since the read data requested is from a remote write cycle (i.e., a write cycle not immediately preceding the read cycle).

The operation of system 100 is substantially similar in the second scenario, when a match occurs in a read cycle after consecutive first, second and third write operations. That is, when the address for a read cycle matches the address for a write cycle contained in the third register 116, the device operates in a substantially similar manner, but outputs data D3A (rather than data D2A), without a delay.

Figure 4:
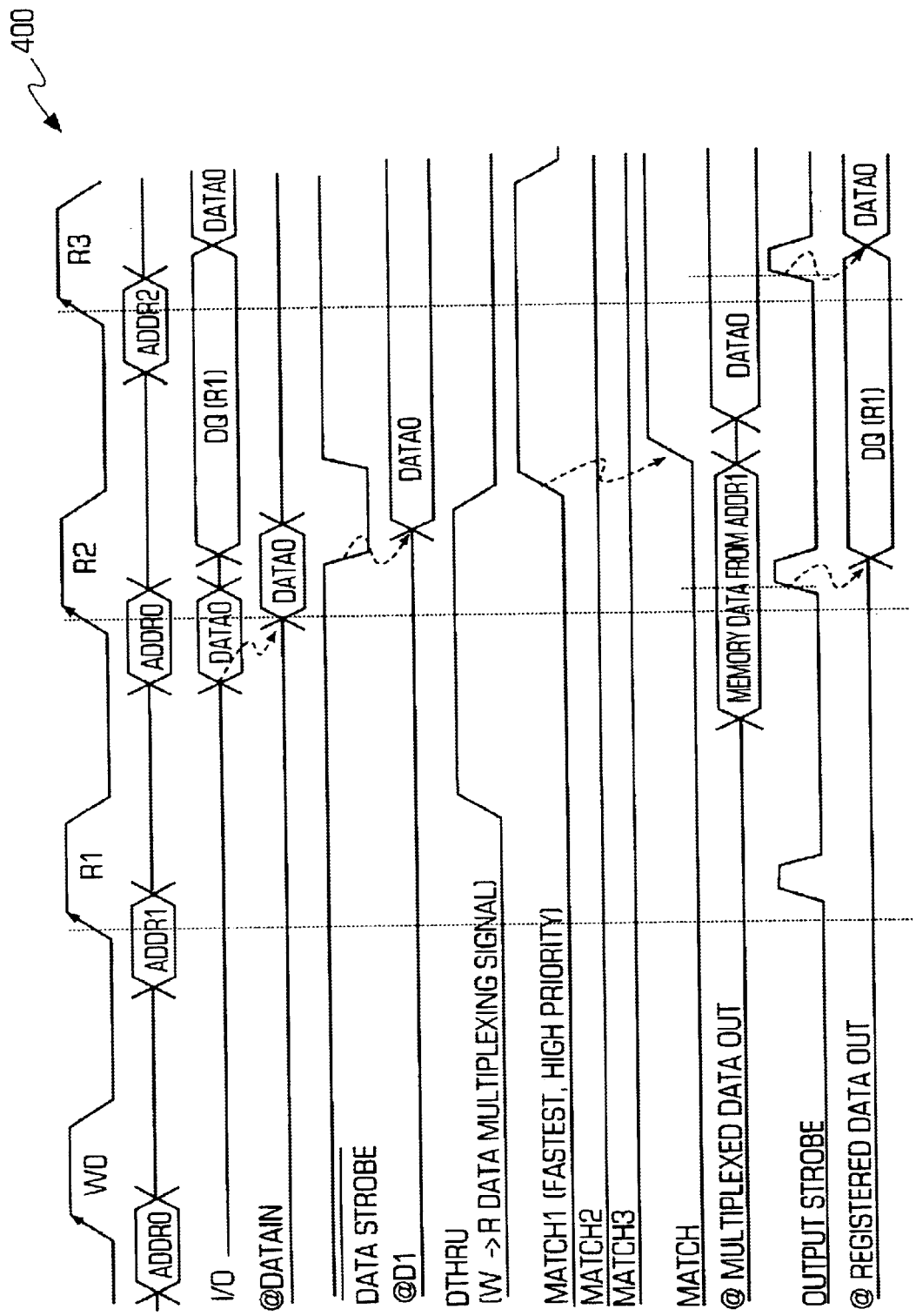
FIG. 4 is an exemplary timing diagram for the present invention illustrating a third match condition, which occurs in a case other than a read after write cycle.

In the third scenario, a match occurs in a case other than in a read after write cycle (e.g., in a read after read cycle). The system 100 operates in a substantially similar manner in all such cases. FIG. 4 is a timing diagram 400 illustrating one example of such a case. In the case shown in FIG. 4, a read operation (R2) occurs after a read operation (R1) following a write operation (W0), and requests the data (DATA0) contained at the same address (ADDR0) of the write operation. In this third scenario, no timing conflict exists between the data strobe signal ($\overline{\text{DATASTROBE}}$) and the OUTPUT STROBE signal. The read operations R1 and R2 occur without delay, and the DTRHU signal has no effect on the final outcome.

In this manner, the system 100 allows for read and write operations to occur on an SRAM array with data coherence. The system 100 can continuously receive external read and write commands and perform operations, while resolving timing conflicts between data and output strobe signals. The present invention achieves this performance by utilizing several shift registers and selectively delaying the output strobe signal for certain read after write cycles, thereby allowing the data time to register before outputting the data.

It should be understood that the inventions described herein are provided by way of example only and that numerous changes, alterations, modifications, and substitutions may be made without departing from the spirit and scope of the inventions as delineated within the following claims.

What is claimed is:

1. An SRAM system with data coherence comprising:
   an SRAM array;
   a plurality of registers for holding data and addresses for write cycles;
   a data strobe line that provides a data strobe signal for selectively registering data in the plurality of registers;
   an output strobe line that provides an output strobe signal for selectively outputting data from the SRAM array for read cycles; and
   an output strobe circuit that is coupled to the output strobe line and that is adapted to selectively delay the output strobe signal in response to a first match condition which occurs when a read cycle immediately follows a write cycle and requests data from the same address as the write cycle, the delay being effective to allow sufficient time for the data to be registered and selected.

2. The SRAM system of claim 1 wherein the plurality of registers includes first, second and third address shift registers and first, second and third data shift registers.

3. The SRAM system of claim 2 further comprising a first latch that is associated with the second data shift register and that allows data transferred to the second data shift register to be available before it is available in the second data shift register.

4. The SRAM system of claim 3 further comprising a second latch that is associated with the third data shift register and that allows data transferred to third data shift register to be available before it is available in the third data shift register.

5. The SRAM system of claim 4 wherein the first and second latches allow data transferred to the second and third shift register, respectively, to be available a half cycle early.

6. The SRAM system of claim 1 further comprising a read address register for storing addresses for read cycles.

7. The SRAM system of claim 6 further comprising a plurality of comparators for comparing addresses in the plurality of registers to addresses within the read address register to determine whether a match condition exists.

8. The SRAM system of claim 7 further comprising at least one latch that is associated with at least one data shift register and that allows data transferred to the at least one data shift register to be available early, and at least one multiplexer for selectively outputting data from the at least one latch in response to a second match condition, which occurs when a read cycle follows two or more consecutive write cycles and requests the same data as a first write cycle.

9. The SRAM system of claim 8 wherein the at least one latch allows data to be available a half cycle early.

10. The SRAM system of claim 8 wherein said at least one multiplexer is further adapted to selectively output data from one of the data shift registers in response to a third match condition, which occurs in a case other than a read after write cycle.

11. The SRAM system of claim 1 further comprising an input/output pad for selectively transferring data into and out of the SRAM system.

12. The SRAM system of claim 1 further comprising:
    an output multiplexer which is adapted to receive data from the plurality of registers and data from the SRAM array and to selectively communicate the data to an output register based on whether a match condition exists.

13. A method for providing data coherence in an SRAM device, comprising the steps of:
    detecting read and write cycles;
    storing data and addresses for write cycles in a plurality of registers;
    selectively registering data for write cycles in the plurality of registers by use of a data strobe signal;
    selectively outputting data for read cycles by use of an output strobe signal;
    detecting a match condition, which occurs when a read cycle immediately follows a write cycle and requests data from the same address as the write cycle; and
    selectively delaying the output strobe signal in response to the match condition, the delay being effective to allow sufficient time for the data to be registered and selected.

14. The method of claim 13 wherein the plurality of registers includes first, second and third address shift registers and first, second and third data shift registers.

15. The method of claim 13 further comprising the step of comparing external read addresses to addresses stored in the plurality of registers to determine whether a match condition exists.

16. The method of claim 15 further comprising the steps of:
    storing data within at least one latch associated with at least one data shift register;
    detecting a second match condition, which occurs when a read cycle follows two or more consecutive write cycles and requests the same data as a first write cycle; and
    selectively outputting data from a latch in response to a second match condition.

17. The method of claim 16 wherein the at least one latch allows data transferred to the at least one data shift register to be available before it is available in the at least one data shift register.

18. The method of claim 17 wherein the at least one at least one latch allows data transferred to the at least one data shift register to be available a half cycle before it is available in the at least one data shift register.

19. The method of claim 16 further comprising the steps of:
    detecting a third match condition, which occurs in a case other than a read after write cycle; and
    selectively outputting data from one of the data shift registers in response to the third match condition.

* * * * *